United States Patent
Cox (10) Patent No.: US 6,670,807 B2
(45) Date of Patent: Dec. 30, 2003

(54) PROXIMITY SENSOR DETECTING LOSS OF MAGNETIC FIELD COMPLETE

(75) Inventor: Damon Keith Cox, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/053,445

(22) Filed: Jan. 16, 2002

(65) Prior Publication Data

US 2003/0132746 A1 Jul. 17, 2003

(51) Int. Cl.[7] ............................................... G01B 7/14
(52) U.S. Cl. .................................. 324/207.26; 324/207.2
(58) Field of Search ............................ 324/202, 207.12, 324/207.2, 207.21, 207.22–207.26, 251; 338/324; 901/46

(56) References Cited

U.S. PATENT DOCUMENTS

| 4,103,232 | A | | 7/1978 | Sugita et al. ............. 324/158 F |
|---|---|---|---|---|
| 4,229,696 | A | * | 10/1980 | Gustafson ............... 324/207.26 |
| 4,524,932 | A | * | 6/1985 | Bodziak ....................... 246/247 |
| 5,022,695 | A | | 6/1991 | Ayers ........................... 294/88 |
| 5,447,409 | A | * | 9/1995 | Grunes et al. ............ 414/744.6 |
| 5,469,035 | A | * | 11/1995 | Lowrance ................. 318/568.1 |
| 5,563,798 | A | * | 10/1996 | Berken et al. ............... 700/218 |
| 5,740,062 | A | * | 4/1998 | Berken et al. ............... 700/218 |
| 5,742,161 | A | * | 4/1998 | Karte ...................... 324/207.16 |
| 5,796,486 | A | * | 8/1998 | Jacob ........................ 356/614 |
| 5,955,858 | A | * | 9/1999 | Kroeker et al. ......... 318/568.11 |
| 6,060,721 | A | | 5/2000 | Huang ...................... 250/559.4 |
| 6,060,880 | A | * | 5/2000 | Guyot et al. .............. 324/207.2 |
| 6,094,912 | A | | 8/2000 | Williford ...................... 60/520 |
| 6,396,260 | B1 | * | 5/2002 | Reichl et al. ........... 324/207.25 |
| 2001/0054895 | A1 | * | 12/2001 | Graff ....................... 324/207.26 |

* cited by examiner

*Primary Examiner*—Jay Patidar
(74) *Attorney, Agent, or Firm*—Pennie & Edmonds LLP (57) ABSTRACT

The proximity sensor includes a magnetic field source (first object) configured to generate a magnetic field, a switch plate (second object) made from a ferrous material, and a magnetic field sensor (detector). The magnetic field source and the switch plate are moveable relative to each another. The magnetic field sensor is disposed close enough to the magnetic field source to detect the magnetic field. In use, when the magnetic field source and the switch plate come into proximity of each another, the magnetic field flows from the magnetic field source to the switch plate, thereby disabling detection of the magnetic field and signaling the proximity.

35 Claims, 8 Drawing Sheets

PROXIMITY SENSOR DETECTING LOSS OF MAGNETIC FIELD COMPLETE

BACKGROUND OF THE INVENTION

1. Field of the Invention

The invention relates generally to position or proximity sensors. More particularly, the invention is directed to an apparatus and method for detecting the position of a semiconductor wafer (hereinafter "wafer") within a semiconductor fabrication system.

2. Description of Related Art

Nowadays, semiconductor fabrication systems are almost entirely automated. Typically, an unprocessed semiconductor wafer is processed into semiconductor micro-chips by automatically exposing each wafer to a number of distinct processes, such as photo masking, etching, or the like. Each wafer is a thin slice of base material, typically silicon, cut from an ingot or "boule." The most common wafer diameters are 200 mm or 300 mm (±1 mm), having a thickness of approximately 0.85 mm. Because of the nature of the base material and the thinness of each slice, the wafers can easily be damaged through mishandling.

Modern semiconductor fabrication systems typically utilize cluster tools having multiple process chambers clustered around a central chamber housing a wafer handling robot. Various semiconductor fabrication processes occur at each process chamber, such as degassing, substrate pre-conditioning, cool down, chemical vapor deposition, physical vapor deposition, etching, or the like. These cluster tools also typically includes one or more cassettes in which multiple wafers are stacked prior to and after fabrication. The cassette is typically passed into the cluster tool through a loading chamber, or load-lock. The centrally located wafer handling robot has access to the multiple process chambers and the loading chamber through ports coupling each chamber to the central chamber.

Furthermore, the cluster tool forms a sealed environment that is controlled to limit potential contamination of the wafers and to ensure that optimal processing conditions are maintained. Examples of cluster tools can be found in U.S. Pat. Nos. 5,955,858, 5,447,409, and 5,469,035, all of which are incorporated herein by reference.

To increase fabrication efficiency, a high throughput of wafers through each cluster tool is desirable. One of the ways to achieve a high throughput is by increasing the speed that each wafer is transported between process chambers by the wafer handling robot, i.e., reducing the time between individual processes. An increased handling speed, however, escalates the potential for a wafer to dislodge from a clamping mechanism holding the wafer at the distal end of the wafer handling robot. If a wafer were to dislodge, not only will the wafer be damaged, but it may damage the entire cluster tool and negatively impact the overall throughput. It is therefore desirable to accurately sense the position of the wafer handling robot and more importantly the position of a wafer carried by the wafer handling robot. Furthermore, true automation of the semiconductor fabrication process requires knowing the location of the wafer handling robot and/or the wafer at all times.

Detecting the position of the wafer handling robot and/or wafer is subject to a number of criteria, such as:

- it must be determined whether each wafer is securely grasped or clamped by the wafer handling robot, but not overly so, so as to damage the fragile wafer;
- it must be determined that the clamping and placement of each wafer is precise and accurate since any misplacement might negatively impact a process and/or damage the wafer;
- the position or proximity sensor must be heat resistant, as some of the processes may expose it to high temperatures;
- the position or proximity sensor must not introduce any particulates or contaminants into the closed environment that can ultimately damage the wafer or semiconductors (it has been found that particulates as small as the critical dimension or line width of a semiconductor device, can damage the integrity of an integrated circuit formed on a wafer); and
- it must be determined if a wafer is dislodged from the clamping mechanism so that the wafer handling robot can be halted before further damage can occur.

Figure 1:
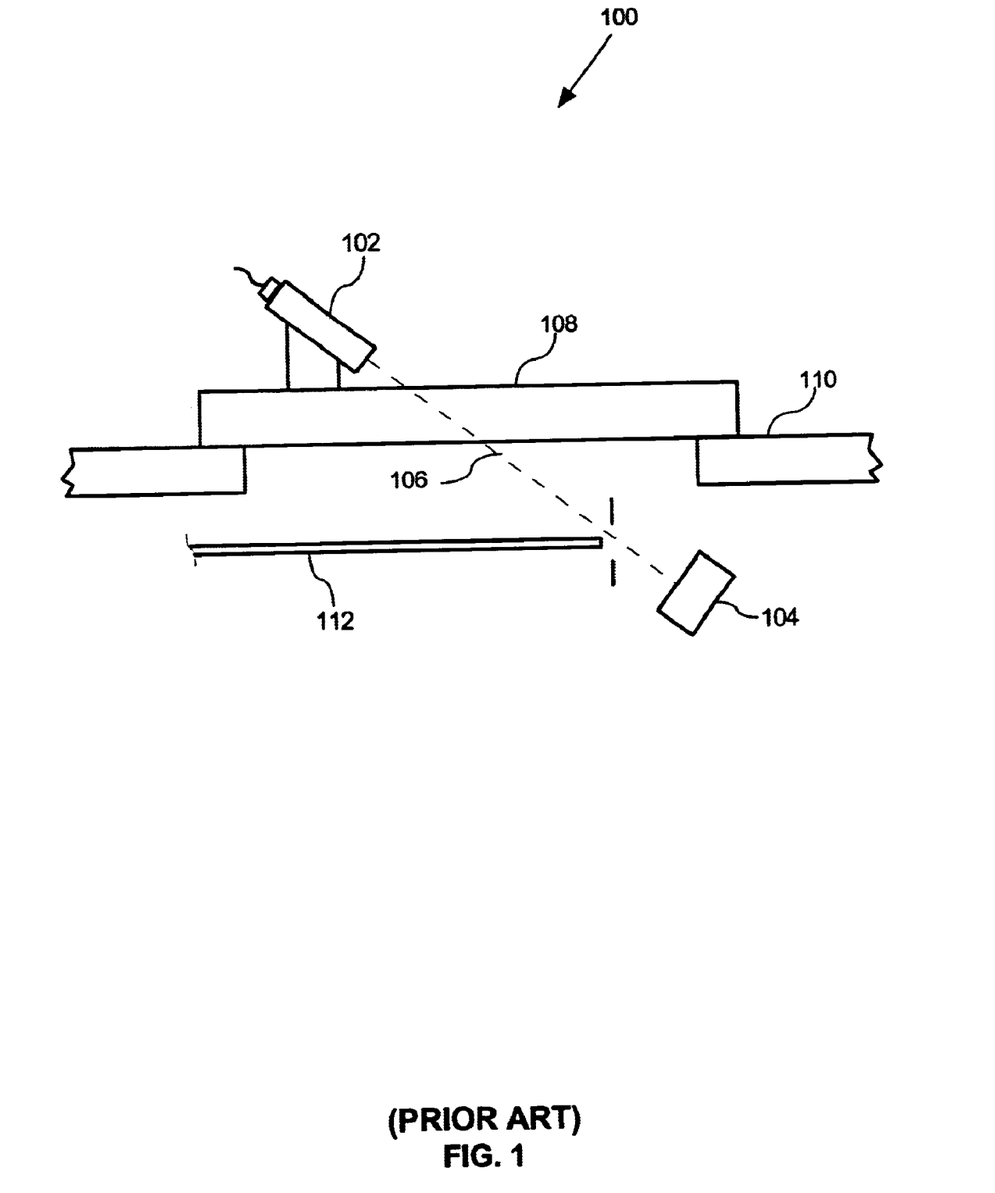
FIG. 1 is a partial side view of a prior art optical detection device.

Currently, the position of a wafer is sensed by optical detection devices. Several such optical detection devices are disclosed in U.S. Pat. Nos. 5,563,798; 5,740,062; and 5,796,486. A generic optical detection device 100 is shown in FIG. 1. The primary components of such an optical detection device include a light emitting element 102, such as a laser, and a light sensing element 104, such as a photo diode. Light 106 is emitted from the light emitting element 102 and passes through a transparent window 108 in a wall 110 of a chamber. When a wafer 112 is not present, the light 106 passes through the transparent window 108 and is detected by the light sensing element 104. Conversely, when a wafer 112 is present, the light 106 passes through the transparent window 108 and is reflected off the surface of the wafer 112, thereby not being detected by the light sensing element 104.

Such optical detection devices, however, have a number of drawbacks. Not only do these devices require the installation of transparent windows, but they also require the use of expensive lasers and photo diodes. Also, the need for a transparent window hampers future retrofits and/or upgrades to the system, as the position of existing windows usually dictates the location of future sensors.

Further, misalignment of any of the optical components in the optical detection device may lead to a detection failure. Still further, reflected or stray light detected by the optical detection device may result in false readings. What is more, maintaining alignment requires continual maintenance and testing, which is both time consuming and costly.

In light of the above, there is a need for an improved wafer position or proximity sensor that addresses the abovementioned drawbacks.

BRIEF SUMMARY OF THE INVENTION

Currently, in semiconductor fabrication systems, optical or proximity sensors are used to sense the position or proximity of a wafer handling robot within the system. The present invention provides a less expensive and more flexible sensing alternative that does not require a transparent viewport window. This provides more flexibility for upgrades, retrofits, new product development, etc.

According to the invention there is provided a proximity sensor. The proximity sensor includes a magnetic field source (first object) configured to generate a magnetic field, a switch plate (second object) made from a ferrous material, and a magnetic field sensor (detector). The magnetic field source and the switch plate are moveable relative to each another. The magnetic field sensor is disposed close enough to the magnetic field source to detect the magnetic field. In use, when the magnetic field source and the switch plate come into proximity of each another, the magnetic field flows from the magnetic field source to the switch plate, thereby disabling detection of the magnetic field and signaling the proximity.

Further, according to the invention there is provided a proximity sensor for a semiconductor wafer fabrication system. The proximity sensor has a chamber including at least one wall having at least a portion thereof made of a non-ferrous material. The proximity sensor also includes a wafer handling robot configured to operate within the chamber. A magnetic field source is coupled to the wafer handling robot and is configured to generate a magnetic field, which is detected by a magnetic field sensor disposed outside of the chamber adjacent the portion of the chamber wall. A switch plate made from a ferrous material is coupled to the wafer handling robot and is configured to make contact with the magnetic field source to disable detection of the magnetic field by the magnetic field sensor.

Still further, according to the invention there is provided a method for determining the proximity of two objects to each another. A magnetic field source (first object) generates a magnetic field, which is detected by a magnetic field sensor (detector). A switch plate (second object) made from a ferrous material and the magnetic field source are brought into proximity of each another, such that the magnetic field flows from the magnetic field source to the switch plate. A loss of magnetic field is sensed at the detector. Finally, the proximity is signaled based on the loss of magnetic field.

Because the proximity sensor is not optically-based, it does not need to be positioned next to a transparent window in the semiconductor fabrication system. Any part of the system that would ordinarily be expected to require service is located on the outside of the chamber walls, i.e., not in the vacuum, for ease of service and reduction of downtime. The proximity sensor is also less expensive and more reliable.

BRIEF DESCRIPTION OF THE DRAWINGS

For a better understanding of the nature and objects of the invention, reference should be made to the following detailed description, taken in conjunction with the accompanying drawings, in which.

Like reference numerals refer to corresponding parts throughout the several views of the drawings.

DETAILED DESCRIPTION OF THE INVENTION

For ease of explanation the following description and drawings represent proximity sensors use in a process tool of a semiconductor fabrication system. It should, however, be clear to those skilled in the art that the present invention may be embodied in any system without departing from the spirit and scope of the present invention as defined in the accompanying claims. For example, the claimed proximity sensor may be used in the automotive, manufacturing, or aerospace industries.

Figure 2:
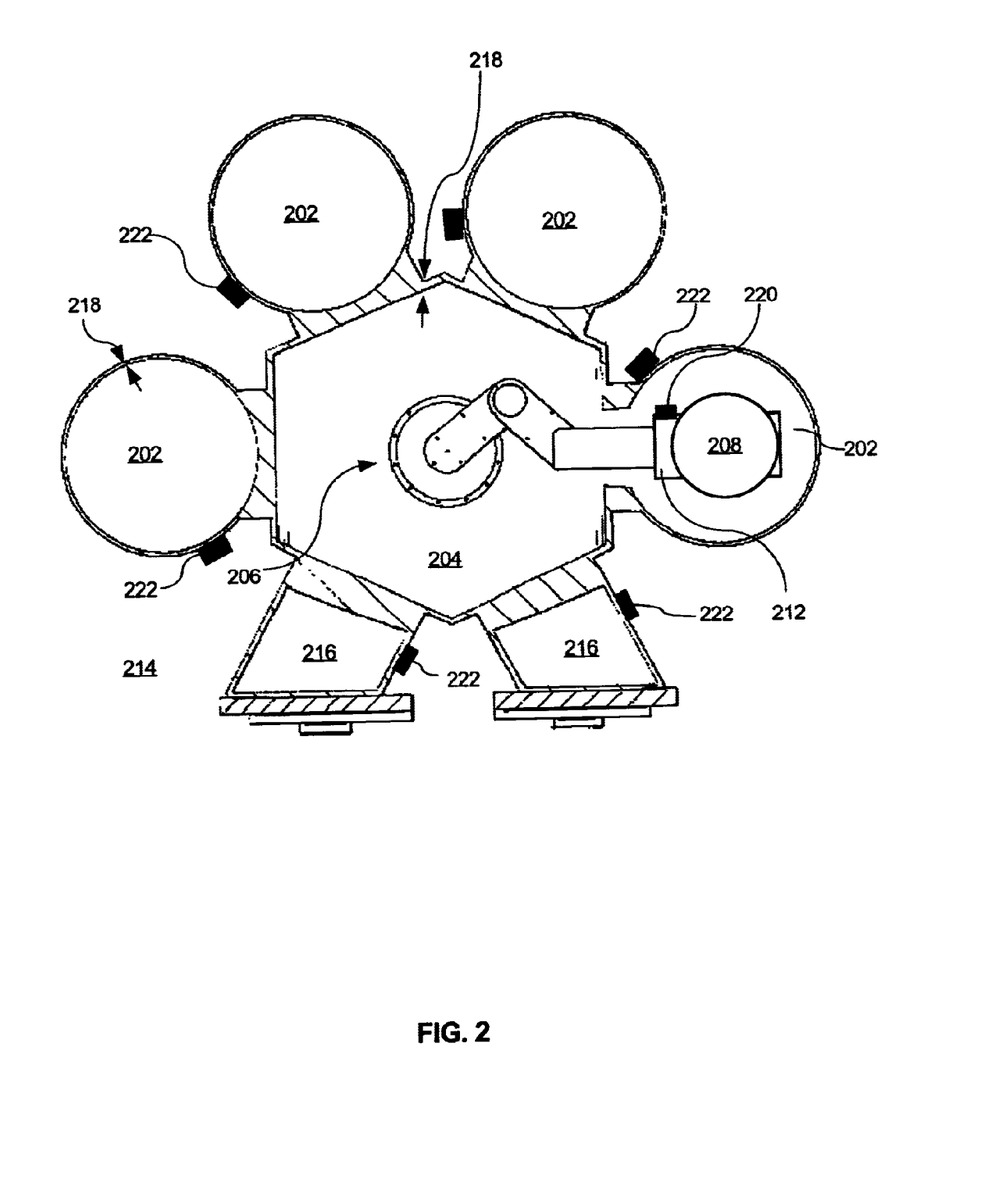
FIG. 2 is a partial top view of a cluster tool that includes a proximity sensor, according to an embodiment of the invention.

FIG. 2 is a partial top view of a cluster tool 200 that includes a proximity sensor. The cluster tool 200 preferably comprises multiple process chambers 202 surrounding a central chamber 204. The cluster tool also includes one or more loading chambers 216 through which wafers may be introduced into, or withdrawn from, the cluster tool 200.

To ensure that optimal processing conditions are maintained by limiting potential contamination of the wafers, each process chamber 202, as well as the central chamber 204, are sealed-off from the outside environment 214 by means of one or more chamber walls 218. This interior sealed-off environment is preferably kept at vacuum.

The central chamber 204 includes a wafer handling robot 206 that transports wafers 208 between the process chambers 202 and/or between the process chambers 202 and the loading chambers 216. The wafer handling robot 206 is any suitable robot that can securely and efficiently grasp, transport, and release wafers. In a preferred embodiment, the wafer handling robot 204 is a frog-leg type robot, a Selectively Compliant Articulated Robot Arm (SCARA) type robot (shown), or the like. The distal end of the wafer handling robot 206 includes a wafer carrying end effector or blade 212 on which a wafer 208 is transported.

A magnetic field source 220, such as a permanent magnet or electromagnet, is coupled to the wafer handling robot 206, as described below. The magnetic field source 220 is any object that generates, or is surrounded by, a magnetic field and that has the property, either natural or induced, of attracting a ferrous material, such as iron or steel.

Magnetic field sensors 222 are attached to the outside of the chamber walls 216 wherever detection is desired. The magnetic field sensors 222 are any devices that are capable of detecting the presence of an electric field generated by the magnetic field source 220. The magnetic field sensors 222 measure the amount and direction of any magnetic field (flux) in its presence or passing through it. A preferred magnetic field sensor 222 is a Hall-effect sensor or Hall sensor. A Hall-effect sensor or Hall sensor is a sensor that has an output that changes based on changes in the magnetic field. Recently, the cost and functionality of these sensors has improved substantially.

The Hall-effect sensors are solid state devices that produce an output voltage (VH) proportional to the product of the input current (Ic), the magnetic flux density (B) and the sine of the angle between the magnetic flux density (B) and the plane of the Hall-effect Sensor. A reversal of the direction of either the magnetic field or the control current will result in a polarity change of VH. By holding the control current constant, the Hall voltage is directly proportional to the magnetic field. Suitable Hall-effect sensors are made by F. W. BELL (Orlando, Fla.), a subsidiary of BELL TECHNOLOGIES INC. These Hall-effect sensors are solid-state components that can operate in temperatures from −269 C. to +175 C. and, therefore, can operate near the adverse environment of semiconductor fabrication.

Advantages of using Hall-effect sensors over other detection devices is that the Hall-effect sensors are contactless and have high accuracy, high reliability and low cost. Furthermore, because the Hall-effect sensors are contactless, there is no wear on the sensor components and, therefore, the lifetime of the sensor is not limited by the number of measuring cycles.

Figure 3:
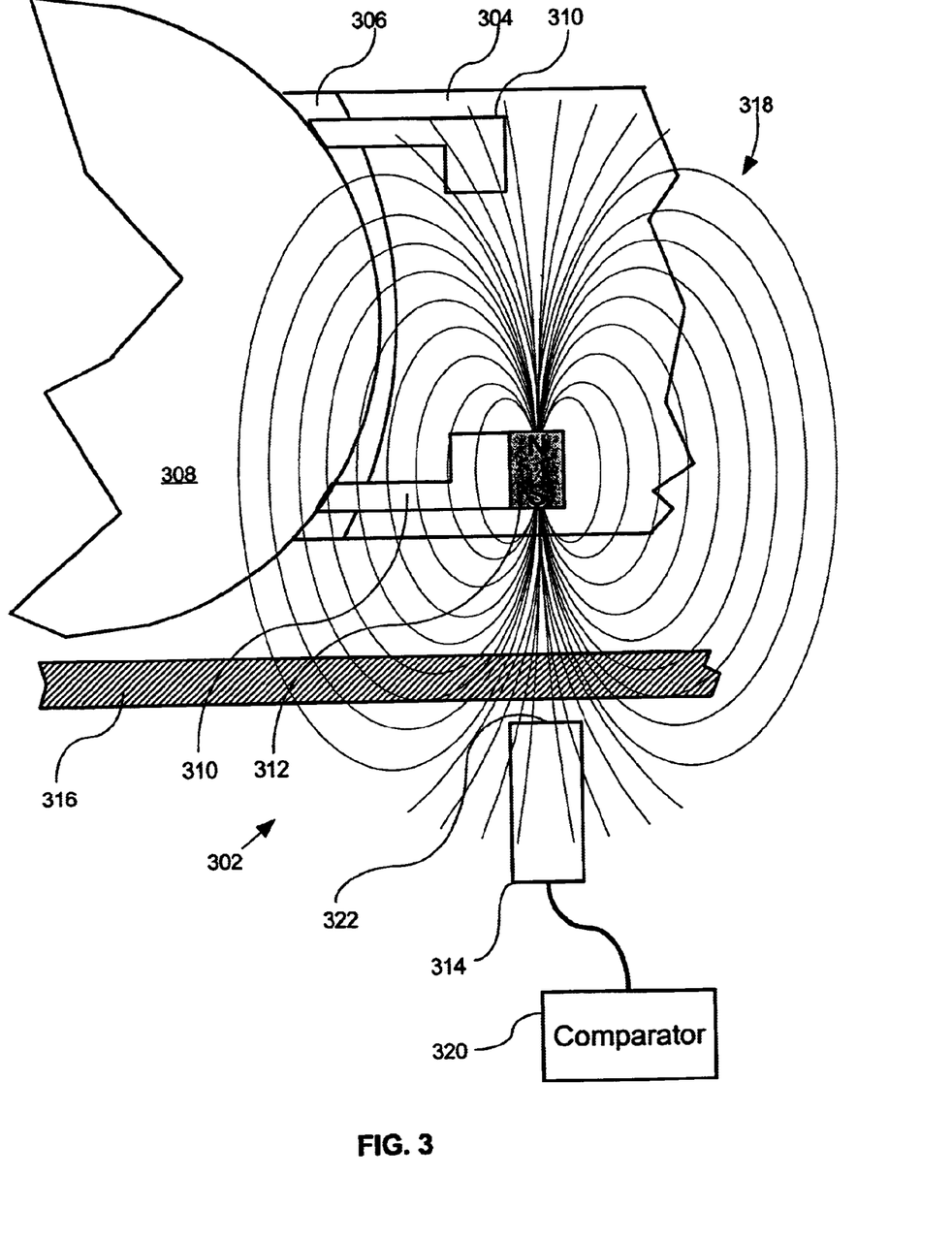
FIG. 3 is a partial top view of a proximity sensor, according to an embodiment of the invention.

FIG. 3 is a partial top view of a proximity sensor 302, according to an embodiment of the invention. A wrist 304 is coupled to the distal end of the wafer handling robot 206 (FIG. 1). A wafer carrying blade 306 is disposed at the distal end of the wrist 304. A wafer 308 is shown positioned on the wafer carrying blade 306. The wafer 308 is clamped onto the wafer carrying blade 306 by a clamping mechanism 310. The wafer clamping mechanism 310 is any suitable device that securely clamps a wafer 308 onto the wafer carrying blade 306 during handling of the wafer 308. The wafer clamping mechanism 310 shown in FIG. 3 is configured to translate along the wrist 304 toward the wafer 308 to clamp the wafer against a bridge (not shown) at the distal end of the blade 306.

A magnetic field source 312, such as a permanent magnet or an electromagnet, is also coupled near to the distal end of the wafer handling robot 206 (FIG. 2). The magnetic field source 312 generates a magnetic field around itself from between its north and south poles. Preferably, the magnetic field source 312 is either coupled directly to the clamping mechanism 310 or to the wrist 304. The material to which the magnetic field source 312 is coupled is a non-ferrous material.

A magnetic field sensor 314, such as a Hall-effect sensor, is disposed on the outside of a chamber wall 316 of a process or central chamber (see FIG. 2). To achieve the greatest detected signal (output voltage (VH)) the face or plane 322 of the magnetic field sensor 314 is disposed substantially perpendicular to the magnetic field source 312 (magnetic flux density (B)). The magnetic field sensor 314 detects the strength of the magnetic flux generated by the magnetic field source 312. The chamber wall 316 is made from a non-ferrous material.

A magnetic field 318 generated or surrounding the magnetic field source 312 is uninhibited by the non-ferrous chamber wall 316 and passes through the chamber wall to be detected by the magnetic field sensor 314. Therefore, the closer the magnetic field source 312 is to the magnetic field sensor 314, the stronger the detected signal.

A comparator 320 is electrically coupled to the magnetic field sensor 314. The comparator 320 compares the signal strength of the magnetic flux detected by the magnetic field sensor 314 against known magnetic flux signals obtained during calibration, to determine the distance between the magnetic field source 312 and the magnetic field sensor 314. In this way, the position of the wafer handling robot, the wrist 304, or the wafer clamping mechanism 310 can be accurately determined. By determining the position of the wafer clamping mechanism 310, the position of the wafer can also be determined.

It should be stressed that it is usually not sufficient to be able to detect the mere presence of a magnetic field source. Other information is typically required, such as whether or not a wafer is present, or whether or not a wafer is properly positioned. It is not the presence of the magnet that is of critical importance, but rather the presence of a wafer or wafer clamping mechanism.

An approach to addressing the above issue is to turn the magnetic field source "on" and "off." As is well understood in the art, a magnetic field is present in the space all around a magnetic field source. However, when placed next to or touching a ferrous material the magnetic field prefers to travel through the ferrous material, being the path of least resistance. When this occurs, there is little or no field present in the space around the magnetic field source, as the field passes through the ferrous material. Therefore, a simple on/off switch can be made using a magnetic field source and a small ferrous switch plate.

Figure 4A:
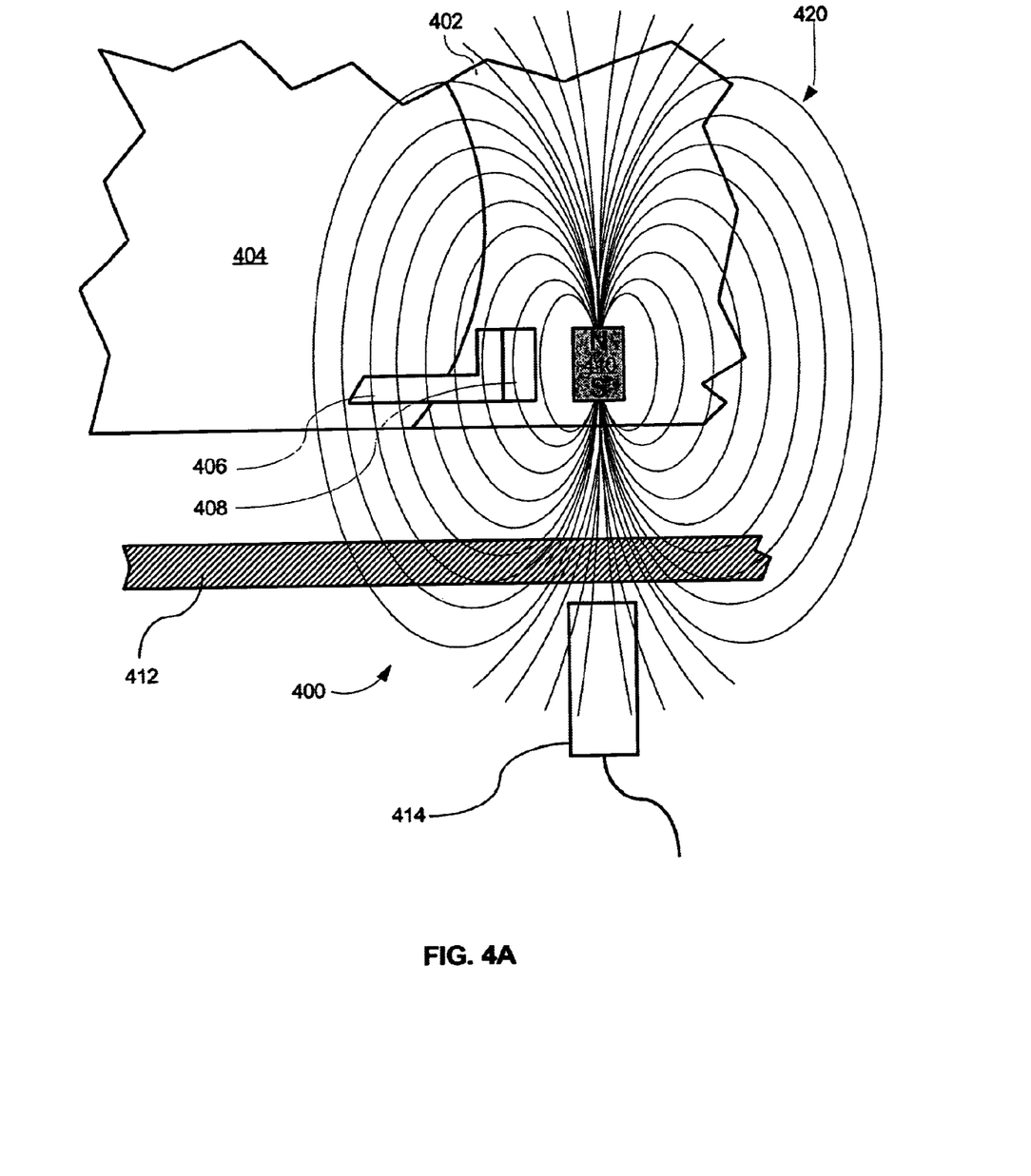
FIG. 4A is a partial top view of a proximity sensor in a detect position, according to another embodiment of the invention.

FIG. 4A is a partial top view of a proximity sensor 400 in a detect position, according to another embodiment of the invention. The proximity sensor 400 is similar to the proximity sensor 302 shown in FIG. 3. A wrist 402 is coupled to the distal end of a wafer handling robot 206 (FIG. 2). A wafer carrying blade 404 is coupled to the distal end of the wrist 402. A wafer clamping mechanism 406 is coupled to the wrist 402. The wafer clamping mechanism 406 is any suitable device that securely clamps a wafer (not shown) onto the wafer carrying blade 404 during handling of the wafer. The wafer clamping mechanism 406 shown in FIG. 4A is configured to translate along the wrist 402 toward the wafer carrying blade 404 to clamp the wafer against a bridge (not shown) at the distal end of the blade 404.

In this embodiment, a switch plate 408 is coupled to the wafer clamping mechanism 406. The switch plate is also free to translate together with the wafer clamping mechanism 406 along the wrist 402 either toward or away from the wafer carrying blade 404. A magnetic field source 410 is affixed to the wrist 402 near the wafer clamping mechanism's fully retracted position.

When no wafer is present on the wafer carrying blade 404, as shown in FIG. 4A, the wafer clamping mechanism 406 is biased away from the magnetic field source 410. This is accomplished by a biasing mechanism, such as a spring, that biases the wafer clamping mechanism toward the wafer carrying blade 404. In this position, the magnetic field source 410 generates a magnetic field 420 that passes through a non-ferrous chamber wall 412 and is detected by a magnetic field sensor 414. To achieve the greatest detected signal (output voltage (VH)) the face or plane of the magnetic field sensor 414 is disposed substantially perpendicular to the magnetic field source 410 (magnetic flux density (B)). The magnetic field sensor 414 detects the strength of the magnetic flux generated by the magnetic field source 410. The material to which the magnetic field source 410 is coupled is also a non-ferrous material.

Figure 4B:
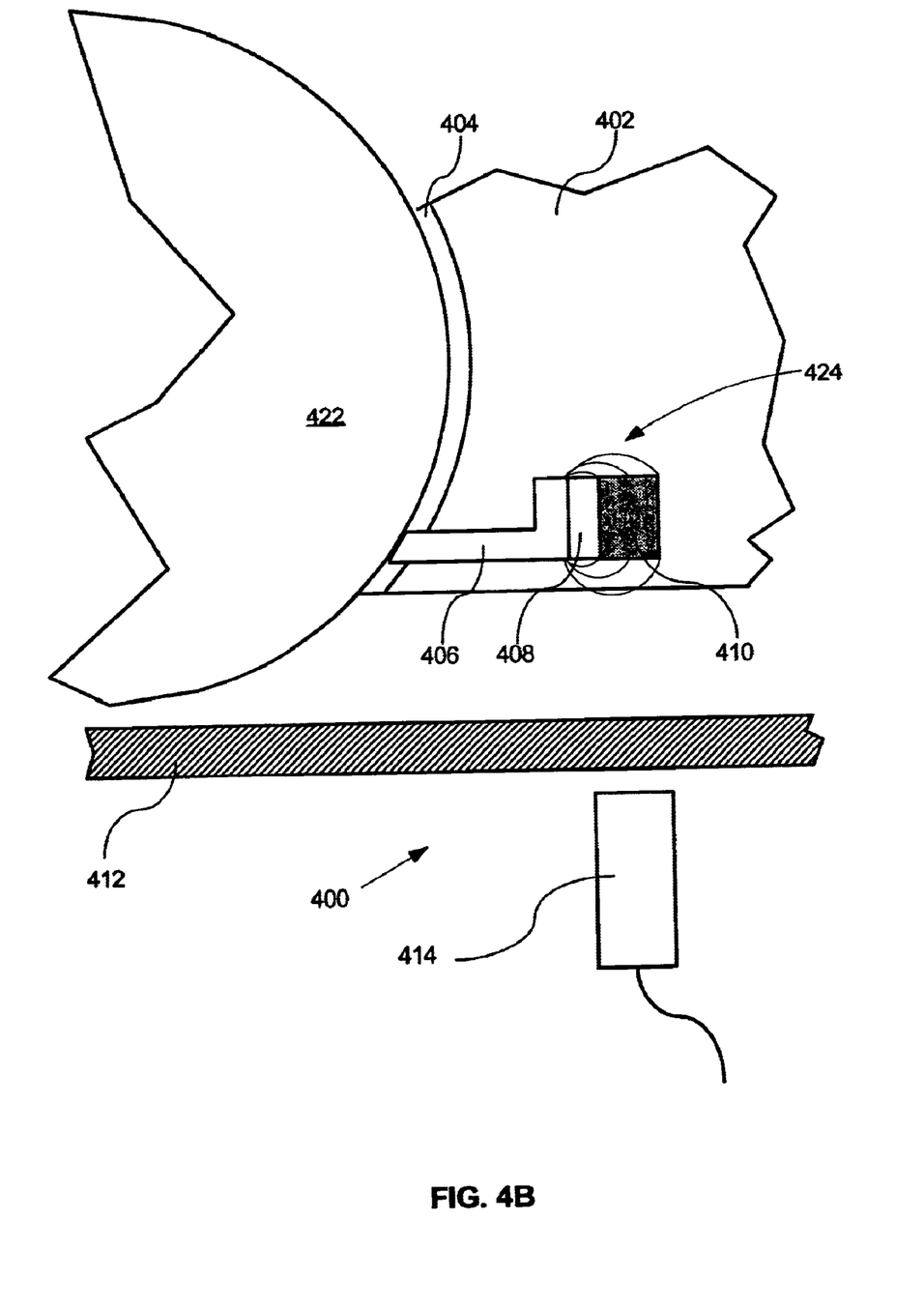
FIG. 4B is a partial top view of the proximity sensor shown in FIG. 4A, in an undetect position.

FIG. 4B is a partial top view of the proximity sensor 400 shown in FIG. 4A, in an undetect position. To transport a wafer 422, the wafer clamping mechanism 406 is retracted and a wafer 422 is positioned on the wafer carrying blade 404. When the wafer clamping mechanism 406 is retracted, the switch plate 408 attached to the wafer clamping mechanism 406 is also retracted near to the magnetic field source 410. The magnetic field 424 generated by the magnetic field source 410 is then attracted to the ferrous switch plate 410, thereby significantly reducing the size of the field 424 generated by the magnetic field source 410.

It should be noted that although a magnetic field is stopped or shielded by ferrous materials, i.e., materials containing iron, such as steel, it passes easily through other non-ferrous materials, such as aluminum. Once a magnetic field comes into close proximity with a ferrous material, it chooses to travel within the ferrous material (path of least resistance). However, the field is unaffected when it passes through non-ferrous materials, such as aluminum or non-magnetic steel. The magnetic field sensor 414 is now no longer able to detect the presence of a magnetic field. In this way, the switch plate 410 acts as an on/off switch for the magnetic field source 410. In other words, a binary signal (magnet/no magnet) is generated by the magnetic field sensor 414.

Therefore, if the wafer 422 is correctly positioned on the blade 404 and is correctly clamped by the wafer clamping mechanism 406, then the magnetic field sensor 414 will not detect a magnetic field generated by the magnetic field source 410. However, if the wafer 422 is not present on the blade, or the wafer slips out of the wafer clamping mechanism and the wafer clamping mechanism 406 extends towards the wafer carrying blade 404, the switch plate 408 will move away from the magnetic field source 410, thereby generating a much larger magnetic field, that is detected by the magnetic field sensor 414. As a result, any abnormal positioning of the wafer 404 can be easily detected.

Figure 5A:
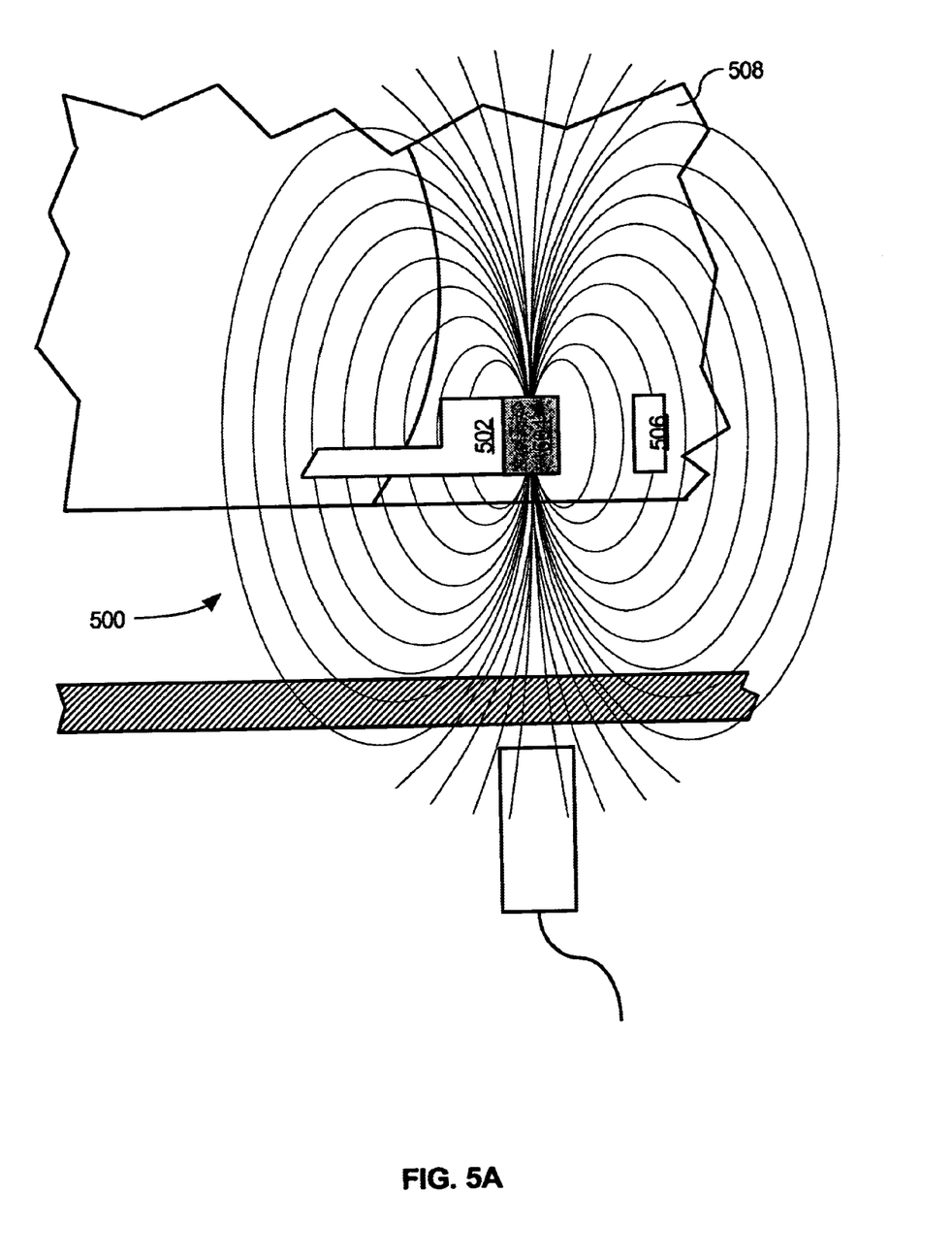
FIG. 5A is a partial top view of a proximity sensor in a detect position, according to yet another embodiment of the invention.

FIG. 5A is a partial top view of a proximity sensor 500 in a detect position, according to yet another embodiment of the invention. The only difference between this embodiment and the embodiment shown in FIG. 4A, is that here the magnetic field source 504 is coupled to, and can move together with, the wafer clamping mechanism 502. Also, unlike in FIG. 4A, here, the switch plate 506 is affixed to the wrist 508.

Figure 5B:
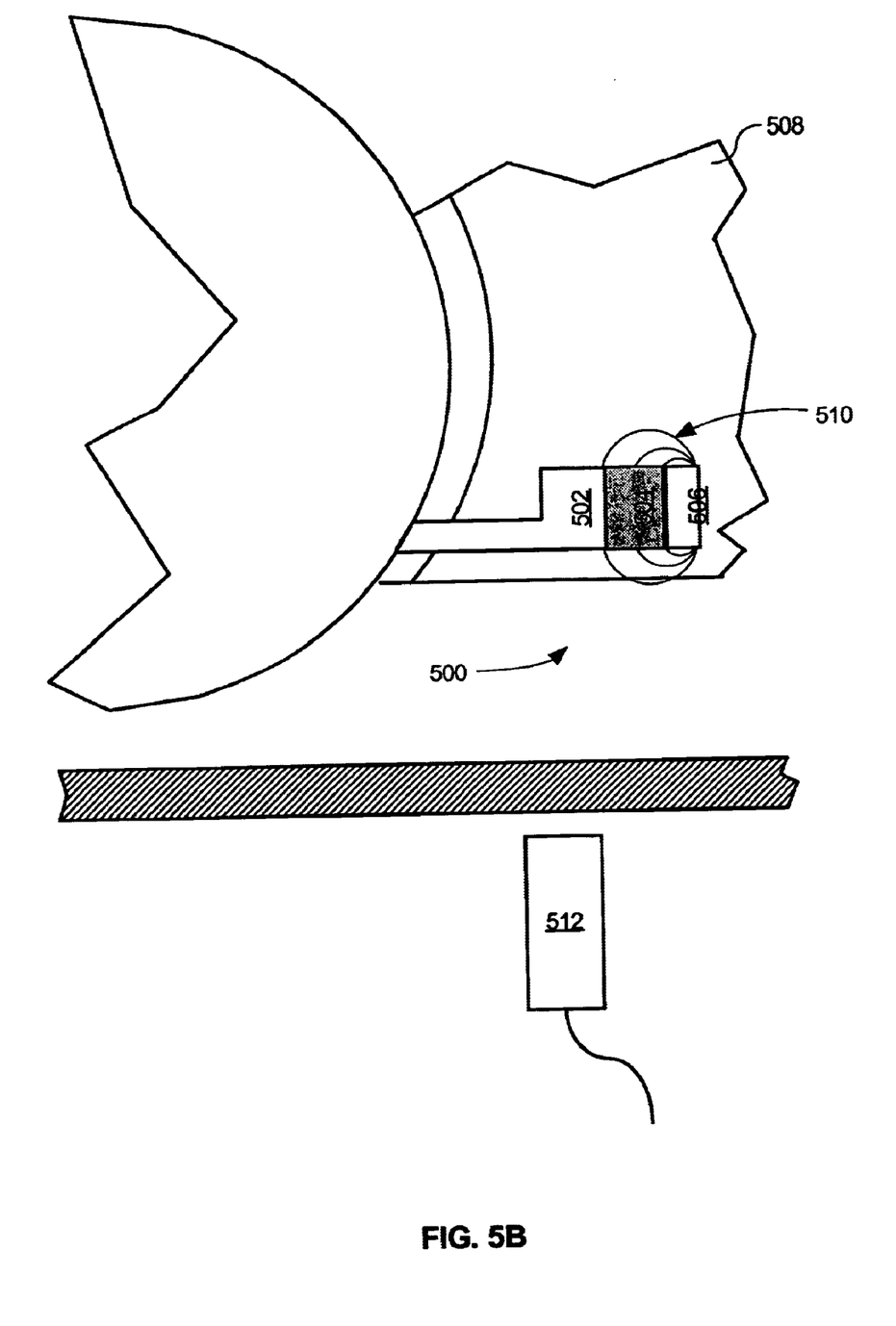
FIG. 5B is a partial top view of the proximity sensor shown in FIG. 5A, in an undetect position.

FIG. 5B is a partial top view of the proximity sensor 500 shown in FIG. 5A, in an undetect position. In a similar manner to FIG. 4B, when a wafer is positioned on the wafer carrying blade, the wafer clamping mechanism 502 is retracted together with the magnetic field source 504. Once the magnetic field source 504 is near to the ferrous switch plate 506, the magnetic field 510 generated by the magnetic field source 504 is redirected or attracted to the ferrous switch plate 506 and can no longer be detected by the magnetic field sensor 512.

Therefore, if the wafer is correctly positioned on the blade and is correctly clamped by the wafer clamping mechanism 502, then the magnetic field sensor 512 will not detect a magnetic field generated by the magnetic field source 404. However, if a wafer is not present on the blade, or the wafer slips out of the wafer clamping mechanism and the wafer clamping mechanism extends towards the wafer carrying blade, then the magnetic field source 504 will move away from the switch plate 506, thereby generating a much larger magnetic field that is detected by the magnetic field sensor 512. As a result, any abnormal positioning of the wafer can easily be detected.

Figure 6:
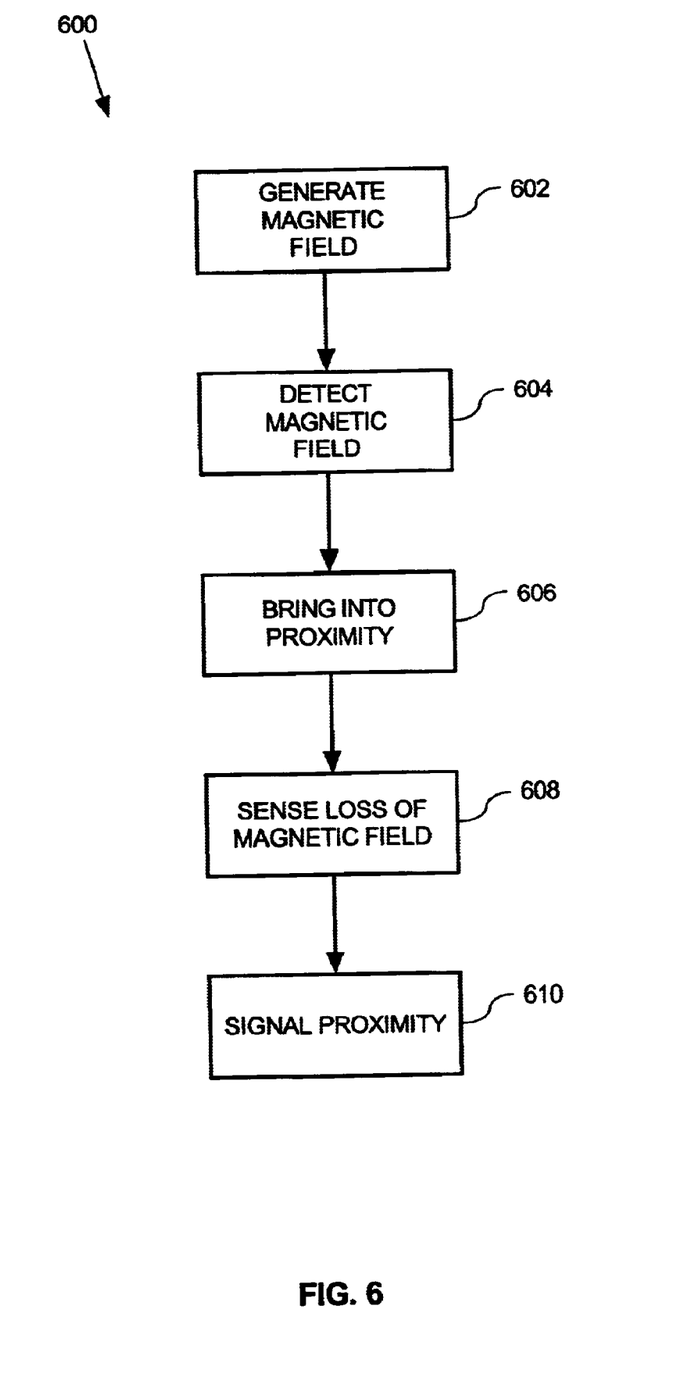
FIG. 6 is a flow chart of a method for determining the position of a wafer within a semiconductor fabrication system.

FIG. 6 is a flow chart of a method 600 for determining the position of a wafer within a semiconductor fabrication system. Firstly, a magnetic field is generated 602 at a magnetic field source (first object) (410 (FIG. 4A) or 504 (FIG. 5A)). The magnetic field source is preferably disposed near the distal end of a wafer handling robot housed within a chamber of a semiconductor fabrication process tool. The chamber preerably has at least a portion of its wall that is nonferrous.

The magnetic field is then detected 604 at the magnetic field sensor (detector) (414 (FIG. 4A) or 512 (FIG. 5B)). The magnetic field sensor is preferably disposed on the outside of the chamber. Subsequently, a switch plate (second object) (408 (FIG. 4A) or 506 (FIG. 5A)) made from a ferrous material and the magnetic field source are brought 606 into proximity of each another, such that the magnetic field flows from the magnetic field source to the switch plate, as described above. A loss of magnetic field is then sensed 608 at the at the magnetic field sensor. The proximity is then signaled 610 based on the loss of magnetic field. This signaling 610 indicates whether the wafer clamping mechanism is in a released or clamped position.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Furthermore, the order of steps in the method are not necessarily intended to occur in the sequence laid out. It is intended that the scope of the invention be defined by the following claims and their equivalents.

What is claimed is:

1. A proximity sensor, comprising:
   a first object configured to generate a magnetic field;
   a second object made from a ferrous material, where said first object and said second object are moveable relative to each other; and
   a detector disposed close enough to said first object to detect said magnetic field,
   such that in use when said first and second objects come into proximity of each other, said magnetic field flows from said first object to said second object, thereby disabling detection of said magnetic field and signaling said proximity.

2. The proximity sensor of claim 1, wherein said detector is separated from said first and second objects by a non-ferrous wall.

3. The proximity sensor of claim 2, wherein said non-ferrous wall forms part of a chamber of a semiconductor fabrication process tool.

4. The proximity sensor of claim 3, wherein said proximity sensor is used to detect the presence of a wafer in said semiconductor fabrication process tool.

5. The proximity sensor of claim 1, wherein said first and second objects are disposed on a wafer handling robot.

6. The proximity sensor of claim 5, wherein said first object is coupled to a wafer clamping mechanism that is movably coupled to said wafer handling robot, and where said proximity sensor is used to detect whether said wafer clamping mechanism has clamped a wafer.

7. The proximity sensor of claim 5, wherein said second object is coupled to a wafer clamping mechanism that is movably coupled to said wafer handling robot, and where said proximity sensor is used to detect whether said wafer clamping mechanism has clamped a wafer.

8. The proximity sensor of claim 1, wherein said detector is a Hall-effect sensor.

9. The proximity sensor of claim 1, wherein said first object is a magnetic field source selected from a group consisting of: a permanent magnet and a electromagnet.

10. A proximity sensor for a semiconductor wafer fabrication system, comprising
    a chamber including at least one wall having at least a portion thereof made of a non-ferrous material;
    a wafer handling robot configured to operate within said chamber;
    a magnetic field source configured to generate a magnetic field, where said magnetic field source is coupled to said wafer handling robot;
    a magnetic field sensor disposed outside of said chamber adjacent said portion, where said magnetic field sensor is configured to detect said magnetic field; and
    a switch plate made from a ferrous material, where said switch plate is coupled to said wafer handling robot and is configured to make contact with said magnetic field source to disable detection of said magnetic field by said magnetic field sensor.

11. The proximity sensor of claim 10, further comprising a wafer clamping mechanism movably coupled to said wafer handling robot.

12. The proximity sensor of claim 11, wherein said magnetic field source is coupled to said wafer clamping mechanism.

13. The proximity sensor of claim 11, wherein said switch plate is coupled to said wafer clamping mechanism.

14. The proximity sensor of claim 10, wherein said chamber is at vacuum and said at least one wall acts as a vacuum barrier.

15. The proximity sensor of claim 10, wherein said magnetic field source is selected from a group consisting of a permanent magnet and an electromagnet.

16. The proximity sensor of claim 10, wherein said magnetic field sensor is a Hall-effect sensor.

17. A method for determining the proximity of two objects to each other, comprising:
 generating a magnetic field at a first object;
 detecting said magnetic field at a detector; and
 bringing a second object made from a ferrous material and said first object into proximity of each another, such that said magnetic field flows from said first object to said second object;
 sensing a complete loss of magnetic field at said detector; and
 signaling said proximity based on said loss of magnetic field.

18. The method of claim 17, wherein said generating further comprises forming said magnetic field near the distal end of a wafer handling robot housed within a chamber.

19. The method of claim 18, wherein said sensing further comprises detecting said loss of magnetic field outside of said chamber through a non-ferrous wall of said chamber.

20. The method of claim 17, wherein said generating comprises inducing a magnetic field at a wafer clamping mechanism coupled near the distal end of said wafer handling robot.

21. The method of claim 20, further comprising determining that said wafer clamping mechanism is in a released position based upon said signaling.

22. A proximity sensor for a semiconductor processing tool, comprising:
 a chamber including at least one wall having at least a portion thereof made of a non-ferrous material;
 a first object positioned within said chamber and configured to generate a magnetic field;
 a ferrous second object positioned within said chamber, where said first object and said second object are moveable relative to one another; and
 a detector disposed outside of said chamber adjacent said portion, where said detector is configured to detect said magnetic field,
 such that in use when said first and second objects come into proximity with each other, said magnetic field flows from said first object to said second object, thereby disabling detection of said magnetic field by said detector and signaling proximity of said first and second objects to each other.

23. The proximity sensor of claim 22, wherein said first and second objects are disposed on a wafer handling robot.

24. The proximity sensor of claim 23, wherein said first object is coupled to a wafer clamping mechanism that is movably coupled to said wafer handling robot, and where said proximity sensor is used to detect whether said wafer clamping mechanism has clamped a wafer.

25. The proximity sensor of claim 23, wherein said second object is coupled to a wafer clamping mechanism that is movably coupled to said wafer handling robot, and where said proximity sensor is used to detect whether said wafer clamping mechanism has clamped a wafer.

26. The proximity sensor of claim 22, wherein said detector is a Hall-effect sensor.

27. The proximity sensor of claim 22, wherein said first object is a magnetic field source is an electromagnet.

28. The proximity sensor of claim 22, wherein said chamber is configured to operate internally at vacuum.

29. A proximity, comprising:
 a chamber including at least one wall having at least a portion thereof made of a non-ferrous material;
 a first object positioned within said chamber and configured to generate a magnetic field;
 a ferrous second object positioned within said chamber, where said first object and said second object are moveable relative to one another; and
 a detector disposed outside of said chamber adjacent said portion, where said detector is configured to detect said magnetic field,
 such that in use when said first and second objects come into proximity with each other, said magnetic field flows from said first object to said second object, thereby disabling detection of said magnetic field by said detector and signaling proximity of said first and second objects to each other.

30. The proximity sensor of claim 29, wherein said first and second objects are disposed on a wafer handling robot.

31. The proximity sensor of claim 30, wherein said first object is coupled to a wafer clamping mechanism that is movably coupled to said wafer handling robot, and where said proximity sensor is used to detect whether said wafer clamping mechanism has clamped a wafer.

32. The proximity sensor of claim 30, wherein said second object is coupled to a wafer clamping mechanism that is movably coupled to said wafer handling robot, and where said proximity sensor is used to detect whether said wafer clamping mechanism has clamped a wafer.

33. The proximity sensor of claim 29, wherein said detector is a Hall-effect sensor.

34. The proximity sensor of claim 29, wherein said first object is a magnetic field source is an electromagnet.

35. The proximity sensor of claim 29, wherein said chamber is configured to operate internally at vacuum.

* * * * *